(12) United States Patent
Shiraishi et al.

(10) Patent No.: US 8,207,558 B2
(45) Date of Patent: Jun. 26, 2012

(54) SEMICONDUCTOR DEVICE, DC/DC CONVERTER AND POWER SUPPLY

(75) Inventors: Masaki Shiraishi, Hitachi (JP); Takayuki Iwasaki, Hitachi (JP); Nobuyoshi Matsuura, Takasaki (JP)

(73) Assignee: Renesas Electronics Corporation, Kawasaki-shi, Kanagawa (JP)

( * ) Notice: Subject to any disclaimer, the term of this patent is extended or adjusted under 35 U.S.C. 154(b) by 0 days.

(21) Appl. No.: 12/405,945

(22) Filed: Mar. 17, 2009

(65) Prior Publication Data

US 2009/0179235 A1 Jul. 16, 2009

Related U.S. Application Data

(63) Continuation of application No. 11/175,288, filed on Jul. 7, 2005, now Pat. No. 7,514,731.

(30) Foreign Application Priority Data

Jul. 9, 2004 (JP) .................................. 2004-203094

(51) Int. Cl.
*H01L 29/76* (2006.01)
*H01L 31/062* (2006.01)
*H01L 31/113* (2006.01)

(52) U.S. Cl. .. 257/268; 257/341; 257/368; 257/E27.004
(58) Field of Classification Search .................. 323/282
See application file for complete search history.

(56) References Cited

U.S. PATENT DOCUMENTS

| | | | |
|---|---|---|---|
| 5,424,892 A * | 6/1995 | Topp et al. ....................... 361/18 |
| 5,905,370 A | 5/1999 | Bryson | |
| 6,088,208 A | 7/2000 | Yamaguchi | |
| 6,285,173 B1 | 9/2001 | Bentolila et al. | |
| 6,400,126 B1 * | 6/2002 | Zuniga et al. ................. 323/282 |
| 2002/0093094 A1 | 7/2002 | Takagawa et al. | |
| 2002/0134999 A1 * | 9/2002 | Hirokawa et al. ............. 257/258 |
| 2002/0163040 A1 | 11/2002 | Kinzer et al. | |
| 2002/0175661 A1 | 11/2002 | Wheeler et al. | |
| 2002/0190285 A1 * | 12/2002 | Sakamoto et al. ............ 257/288 |
| 2003/0016527 A1 | 1/2003 | Rowe et al. | |

FOREIGN PATENT DOCUMENTS

| | | |
|---|---|---|
| JP | 60-160393 | 8/1985 |
| JP | 2002-217416 | 8/2002 |
| JP | 2002-290224 | 10/2002 |
| JP | 2002-368121 | 12/2002 |

(Continued)

*Primary Examiner* — Marcos D. Pizarro
*Assistant Examiner* — Sarah Salerno
(74) *Attorney, Agent, or Firm* — Dickstein Shapiro LLP

(57) ABSTRACT

A semiconductor device in which the self-turn-on phenomenon is prevented that can significantly improve power conversion efficiency. The semiconductor device is a system-in-package for power supply applications in which a high-side switch, a low-side switch, and two drivers are included in a single package. The device includes an auxiliary switch disposed between the gate and source of said low-side switch, and a low-side MOSFET 3 for the low-side switch and an auxiliary MOSFET 4 for the auxiliary switch are disposed on the same chip. In this way, the self-turn-on phenomenon can be prevented, allowing the mounting of a low-side MOSFET 3 with a low threshold voltage and thereby significantly improving power conversion efficiency. The gate of the auxiliary MOSFET 4 is driven by the driver for the high-side MOSFET 2, thereby eliminating the need for a new drive circuit and realizing the same pin configuration as existing products, which facilitates easy replacement.

11 Claims, 13 Drawing Sheets

FOREIGN PATENT DOCUMENTS

| | | |
|---|---|---|
| JP | 2002-369552 | 12/2002 |
| JP | 2003-338555 | 11/2003 |
| JP | 2004519187 | 6/2004 |
| JP | 2004-193535 | 7/2004 |

* cited by examiner

US 8,207,558 B2

SEMICONDUCTOR DEVICE, DC/DC CONVERTER AND POWER SUPPLY

The present application is a continuation of application Ser. No. 11/175,288, filed Jul. 7, 2005, now U.S. Pat. No. 7,514,731, the entire disclosures of which are incorporated herein by reference.

BACKGROUND OF THE INVENTION

1. Field of the Invention

The present invention relates to a semiconductor device in a power supply circuit, and more particularly to a technique for improving power conversion efficiency in a semiconductor device used in DC/DC converters that is referred to as a system-in-package, in which a high-side switch, a low-side switch, and a driver are included in a single package.

2. Background Art

The following is an analysis of the technologies relating to semiconductor devices in power supply circuits.

In response to the growing demand for smaller size and faster load response in power supply circuits, the frequencies of the power MOSFETs (Metal Oxide Semiconductor Field Effect Transistors) used in power supplies are becoming increasingly higher.

In particular, there is a growing tendency to increase current levels and frequencies in the non-isolated DC/DC converters used in the power supply circuits for personal computers and computer game machines. This is due to the increasing current levels in the CPUs to be driven, demand for smaller passive components, such as choke coils, and demand for smaller input/output capacitance.

Non-isolated DC/DC converters are widely used in the power supply circuit for personal computers and computer game machines, for example. As a result of the increasing current and lower voltage levels in CPUs mounted on these electronic systems, there is a need for higher efficiency and smaller size in non-isolated DC/DC converters.

Such non-isolated DC/DC converters consist of a high-side switch and a low-side switch, each employing a power MOSFET.

These switches perform voltage conversion by turning themselves on and off alternately in a synchronized manner. The high-side switch is a switch for controlling the DC/DC converter, while the low-side switch is a switch for synchronous rectification.

There is also the trend toward system-in-packages, with the high-side switch, low-side switch, and their drivers implemented in a single package, in response to demand for modern DC/DC converters with reduced parasitic inductance between chips, faster response, and smaller size.

Hereafter, an example of the conventional system-in-package that the inventors have analyzed as a basis for the present invention will be described with reference to FIGS. 8 to 10.

FIG. 8 shows an example of the circuit configuration of a conventional system-in-package for a DC/DC converter. A system-in-package 29 is made up of a high-side MOSFET 2, a low-side MOSFET 3, and drivers 5 and 6 for driving the individual MOSFETs. The high-side MOSFET 2 is disposed in a semiconductor chip 7; the low-side MOSFET 3 is disposed in a semiconductor chip 8; and the drivers 5 and 6 are disposed in a semiconductor chip 9. These three chips are included in a single package.

The operational principle and the individual terminals of the DC/DC converter employing the system-in-package will be described below. When a PWM signal is inputted from a PWM controller 10 to a PWM input terminal 18, the drivers 5 and 6 drive the gates of the high-side MOSFET 2 and low-side MOSFET 3 via wires 14 and 16. The drivers 5 and 6 are fed with the source potential of the high-side MOSFET 2 and low-side MOSFET 3 via wires 15 and 17, and the individual gate voltages are determined with reference to the source potential. The voltage applied to the gate of each MOSFET is fed from external power supplies VGH and VGL via VGH input terminal 20 and VGL input terminal 19, respectively. Depending on the ratio of the on-period of the high-side MOSFET 2 and low-side MOSFET 3, the voltage applied to an input terminal 23 is converted into a desired voltage and then outputted to an output terminal 24. The output voltage is smoothed by a smoothing inductor 11 and a smoothing capacitor 12.

In this system-in-package, because the high-side MOSFET 2 employs an n-type MOSFET, a bootstrap circuit is used for driving the gate. For this purpose, a capacitor 28 and a boot terminal 21 are provided. Although the bootstrap circuit employs a diode for back-flow prevention purposes, the diode is not shown, as it is irrelevant to the present invention. The system-in-package also includes a VGH monitor terminal 22 and a VGL monitor terminal 26 for monitoring the gate voltages of the high-side MOSFET 2 and low-side MOSFET 3, a power ground terminal 25, and a logic ground terminal 27.

FIG. 9 shows an exterior view and an example of the chip configuration and wire bonding configuration of the conventional system-in-package for the DC/DC converter. The package employs a quad flat non-leaded package (QFN), which is a type of non-leaded surface mounting packaging technology. As shown, the tab of the package is divided into three sections, namely, for semiconductor chip 7 of the high-side MOSFET, semiconductor chip 8 of the low-side MOSFET, and semiconductor chip 9 of the drivers. The individual chips are connected by wire bonding. One feature is that the wires 14 and 16 for driving the gate of the individual MOSFETs and the wires 15 and 17 for transmitting the reference source potential are disposed closely and in parallel, thereby reducing the parasitic inductance in the gate-driver and source-driver sections of the MOSFETs.

In this DC/DC converter, however, if the high-side MOSFET 2 is turned on when the low-side MOSFET 3 is off, the drain voltage (at the output terminal 24 in FIGS. 8 and 9) of the low-side MOSFET 3 increases. This voltage causes a charge current to flow between the gate and source of the low-side MOSFET 3 via the feedback capacitance between the gate and drain of the low-side MOSFET 3, resulting in an increase in the gate voltage of the low-side MOSFET 3. Regarding this phenomenon, if the gate voltage of the low-side MOSFET 3 exceeds a threshold voltage, the low-side MOSFET 3 turns on, whereby a large shoot-through current flows from the high-side MOSFET 2 to the low-side MOSFET 3 ("self-turn-on phenomenon"), which significantly reduces conversion efficiency.

FIG. 10 shows a timing chart of the individual voltages for illustrating the self-turn-on phenomenon. When the high-side MOSFET 2 turns on, the voltage at the output terminal 24 increases, and the gate-source voltage of the low-side MOSFET 3 exhibits peak voltage at the same time as the peak voltage at the output terminal 24 and exceeds the threshold voltage. In an actual low-side MOSFET, a MOSFET with a sufficiently high threshold voltage must be used so that the self-turn-on phenomenon can be avoided. This leads to an increase in conduction loss and an inability to achieve higher efficiency.

As a solution for the aforementioned problem, Patent Document 1 discloses that the low-side switch and an auxiliary switch are built inside the same package, with the auxiliary switch connected between the gate and source of the low-side switch. When the gate voltage of the low-side switch increases, the auxiliary switch is turned on so as to short-circuit the gate-source junction of the low-side switch, thereby preventing the increase in the gate voltage and the self-turn-on phenomenon.

Patent Document 1: JP Patent Publication (Kokai) No. 2002-290224 A

SUMMARY OF THE INVENTION

The inventors have identified the following problems and a lack of analysis in Patent Document 1.

In Patent Document 1, in which the low-side switch and the auxiliary switch are built inside the same package so as to prevent the self-turn-on phenomenon, a separate circuit is required for driving the auxiliary switch, which in turn requires a dedicated control IC. Further, the pin configuration of the package is different from that of existing products, making it difficult to replace existing products with the disclosed package. The publication is also concerned mainly with the concept of implementing the auxiliary switch and the low-side switch on a separate chip in one package, without showing specific device structures for the single-chip implementation of the auxiliary switch and the low-side switch.

The inventors' analysis revealed that the self-turn-on phenomenon, which is a problem also in the above-described system-in-package, cannot be fully prevented by single-package implementation on a separate chip. The publication is also deficient in terms of a description of the system-in-package technology, which is increasingly employed to deal with the higher frequencies and smaller sizes of modern DC/DC converters.

It is therefore an object of the invention to provide a technology for significantly increasing power conversion efficiency in a system-in-package used in a DC/DC converter by including the low-side switch and the auxiliary switch for self-turn on prevention purposes in a single chip and thereby preventing the self-turn-on phenomenon. Because the self-turn-on phenomenon can be prevented within the system-in-package, the system-in-package of the invention can be realized with the same pin configuration as that of existing products and can be easily used to replace them.

It is another object of the invention to provide a system-in-package that utilizes the driver for the high-side switch for driving the auxiliary switch and therefore requires no separate driver circuit, whereby the self-turn-on phenomenon can be easily prevented.

It is yet another object of the invention to provide a system-in-package capable of preventing the self-turn-on phenomenon by fabricating the low-side switch and the final stage of a pre-driver on a single chip, whereby the low-side switch driving capability can be improved and power conversion efficiency can be further increased.

These and other objects of the invention, as well as novel features thereof, will be apparent from the following description in conjunction with the accompanying drawings.

The following is a brief outline of the invention disclosed in the present application.

In one aspect, a system-in-package is provided in which a high-side switch, a low-side switch, and two drivers for individually driving the high-side switch and the low-side switch are included in a single package. The system-in-package of the invention has the following features.

Namely, the system-in-package of the invention includes an auxiliary switch disposed between the gate and source of the low-side switch. The low-side switch and the auxiliary switch are disposed on the same chip.

The auxiliary switch is driven by the driver for driving the high-side switch. The auxiliary switch may also be driven by the output of the level shift-down circuit for driving the high-side switch that has been stepped down by a level shift-down circuit. The auxiliary switch may also be driven by the output of a driver in a stage prior to the final stage of the driver for driving the low-side switch. The low-side switch is comprised of a vertical MOSFET, and the auxiliary switch is comprised of a lateral MOSFET. The gate oxide film of MOSFET for the low-side switch and that of MOSFET for the auxiliary switch are formed in the same process step. The gate-source breakdown voltage of the MOSFET for the auxiliary switch is higher than the gate-source breakdown voltage of the MOSFET for the low-side switch. The drain-source breakdown voltage of the MOSFET for the auxiliary switch is lower than the drain-source breakdown voltage of the MOSFET for the low-side switch. The threshold voltage of the MOSFET for the low-side switch is not more than 1 V.

The system-in-package includes a pre-driver disposed in front of the gate of the low-side switch, and the low-side switch and the pre-driver are disposed on the same chip. The low-side switch is comprised of a vertical power MOSFET, and the pre-driver is comprised of a lateral MOSFET.

In another aspect, the invention provides a DC/DC converter utilizing the aforementioned system-in-package and a power supply system employing the DC/DC converter. The DC/DC converter and the power supply system each comprise a PWM controller for feeding a PWM signal to the drivers for driving the high-side switch and the low-side switch, and an inductor and capacitor for smoothing voltages outputted by the high-side switch and the low-side switch.

The effects provided by the invention disclosed herein are briefly described in the following.

(1) The self-turn-on phenomenon in a system-in-package for power supply applications can be prevented.

(2) As a result, a low-side MOSFET with a low threshold voltage can be used, so that power conversion efficiency can be greatly improved.

DESCRIPTION OF THE PREFERRED EMBODIMENTS

Figure 1:
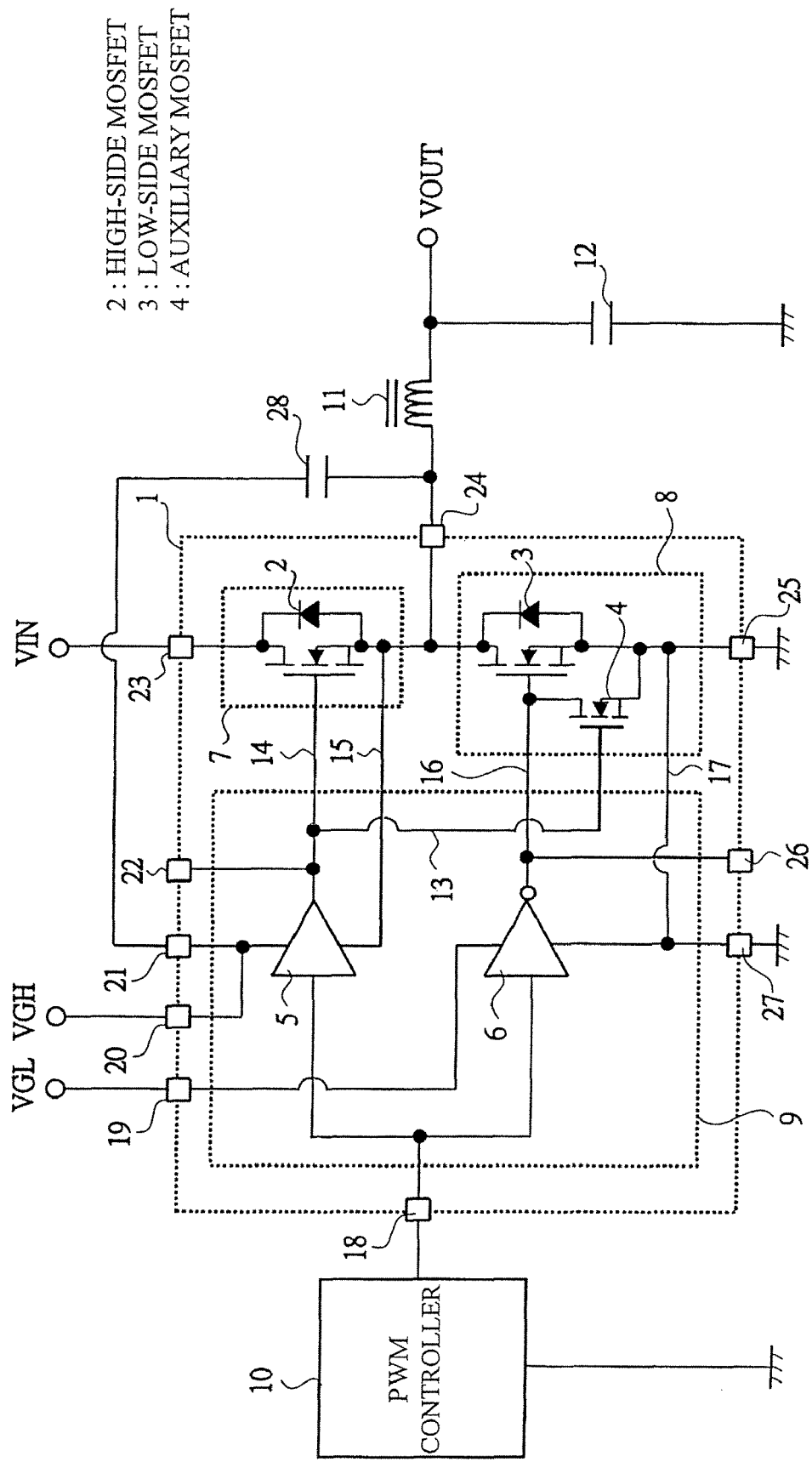
FIG. 1 shows an example of the circuit configuration of a system-in-package in accordance with Embodiment 1 of the invention.

Embodiments of the invention will be hereafter described in detail with reference to the drawings. Members with the same functions are designated as a rule by the same reference numerals throughout the several views of the embodiments, and redundant explanations thereof are omitted. Similarly, redundant explanations are omitted in relation to the background art that has been analyzed as the premise to the present invention.

Embodiment 1

Figure 2:
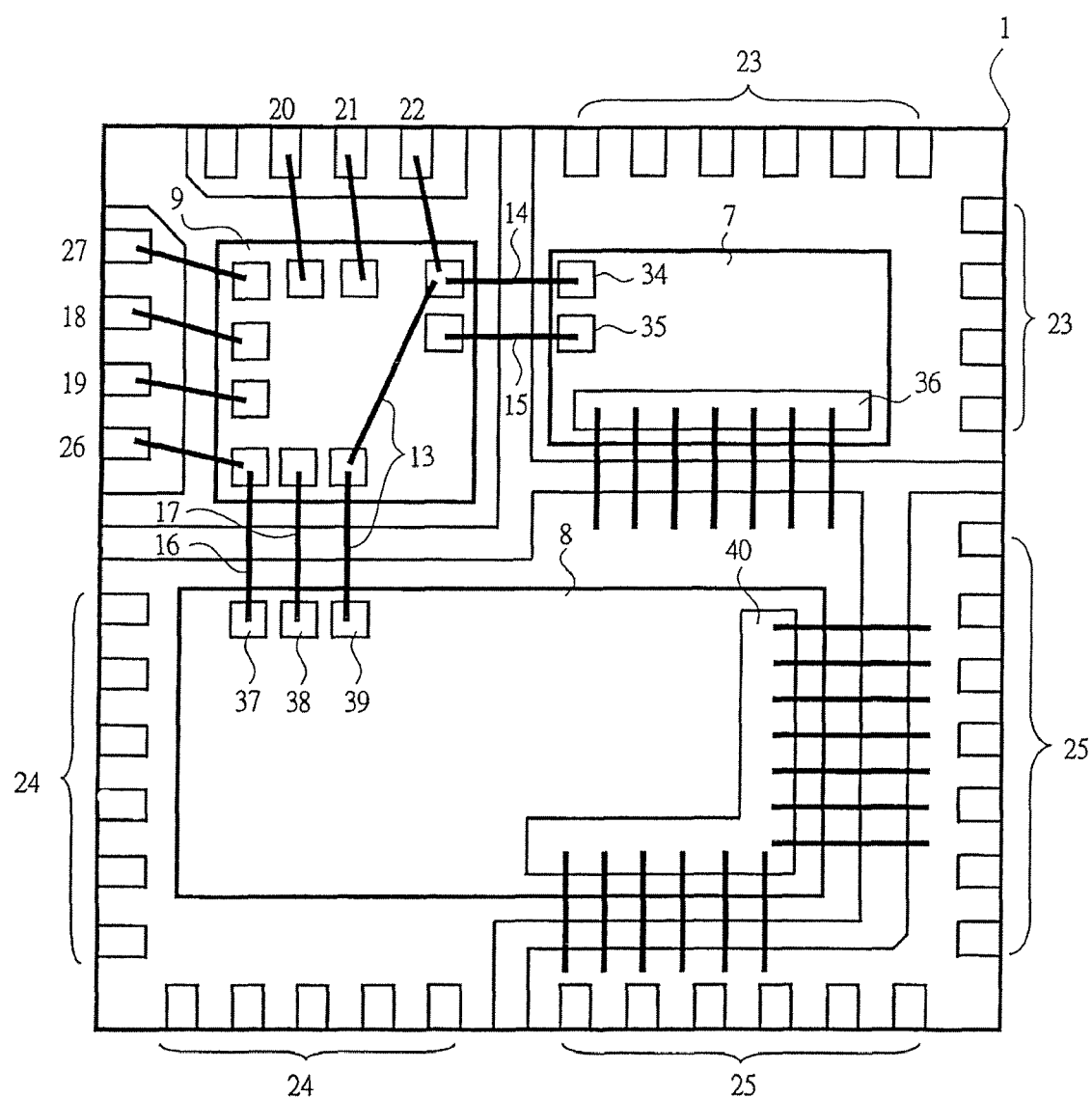
FIG. 2 shows an example of the package exterior view, chip configuration, and wire bonding configuration of Embodiment 1.
Figure 3:
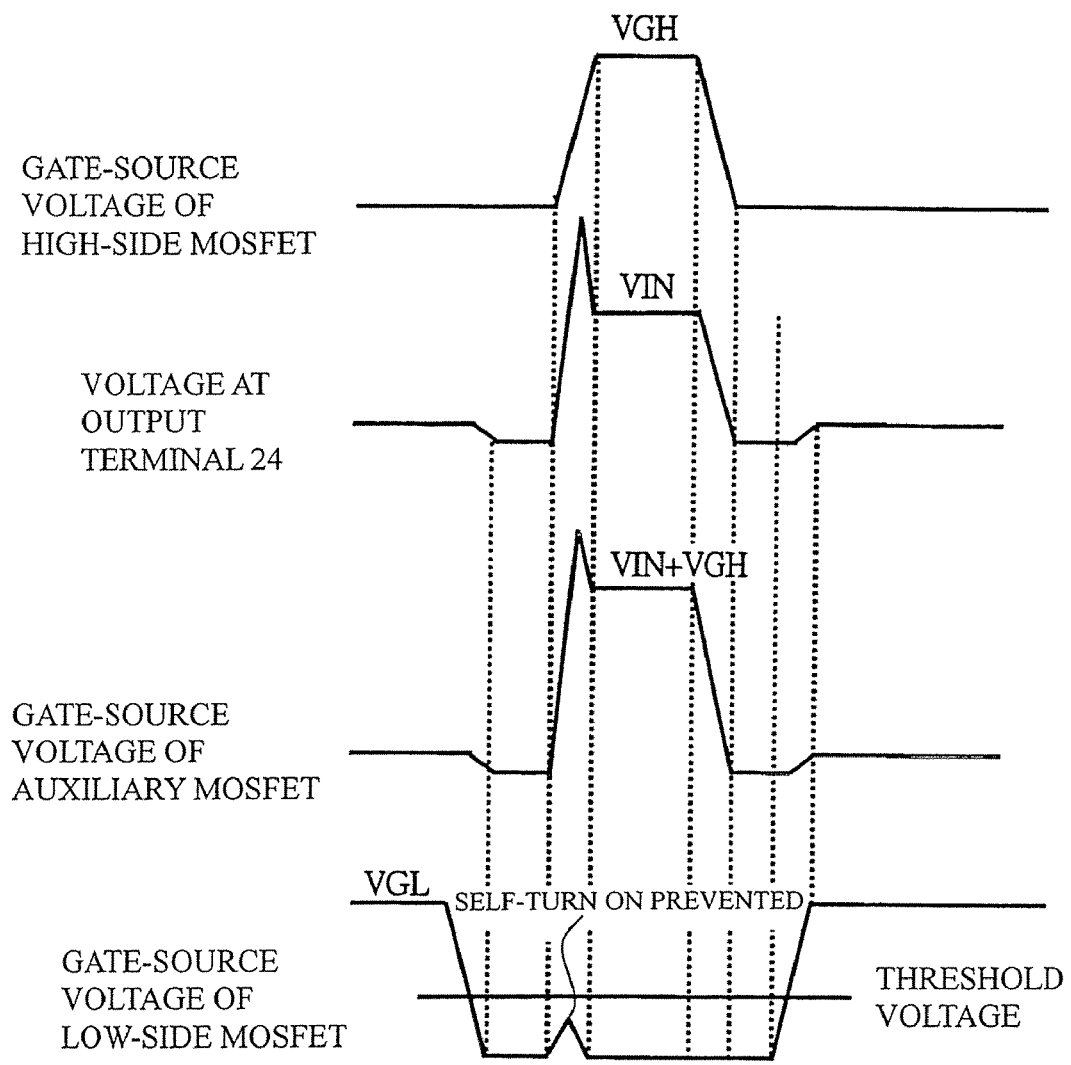
FIG. 3 shows a timing chart of individual voltages illustrating the effect of Embodiment 1 preventing the self-turn-on phenomenon.
Figure 4:
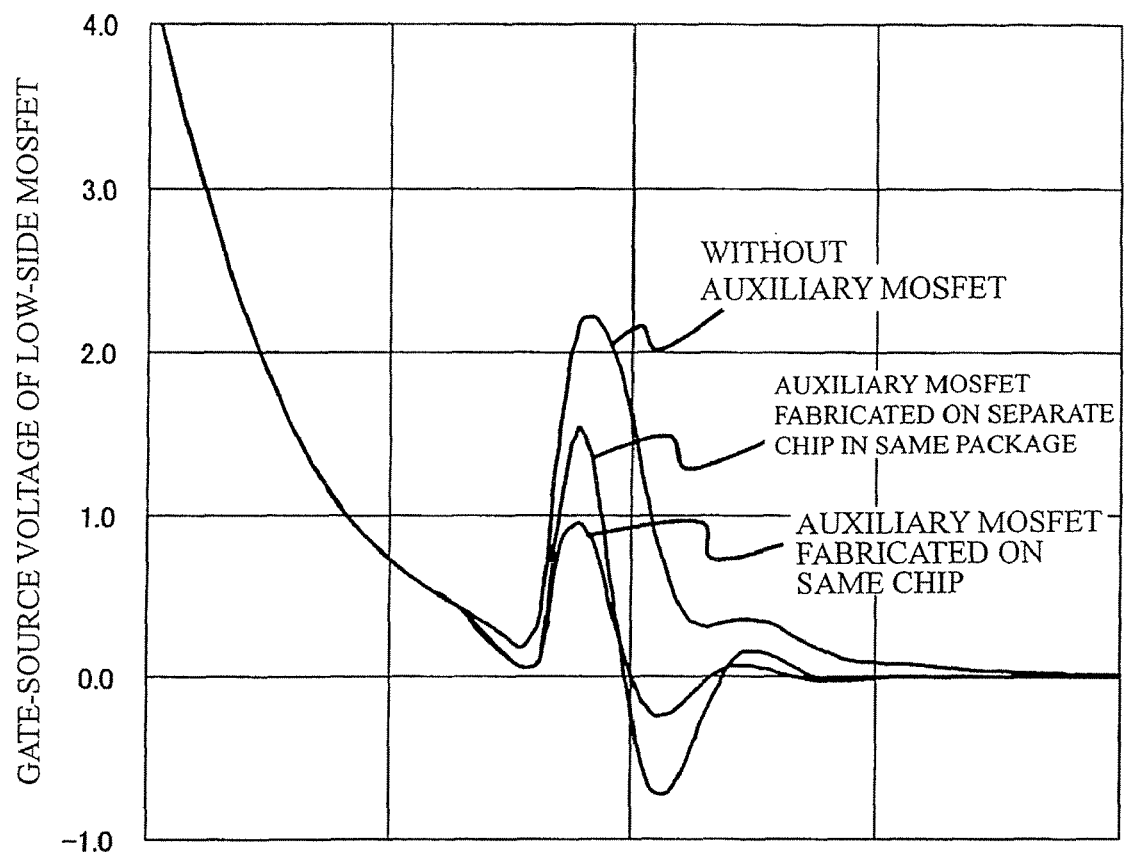
FIG. 4 shows a simulation result illustrating the effect of Embodiment 1.
Figure 5:
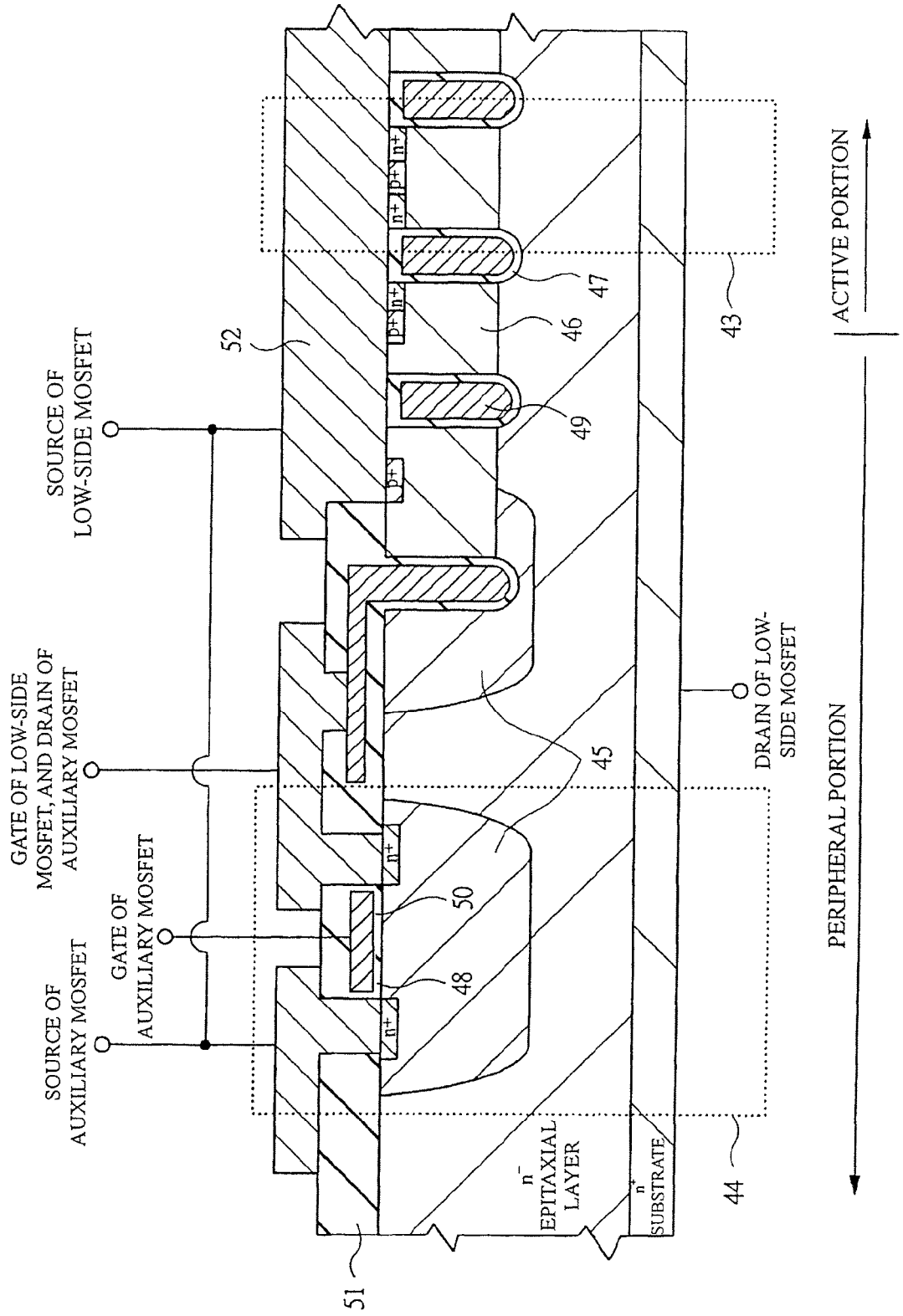
FIG. 5 shows an example of the cross-sectional structure of a device according to Embodiment 1.

FIG. 1 shows an example of the circuit configuration of a system-in-package according to a first embodiment of the invention. FIG. 2 shows an example of the package exterior view, chip configuration, and wire bonding configuration of the system-in-package shown in FIG. 1. FIG. 3 shows a timing chart of individual voltages for illustrating the effect of preventing the self-turn-on phenomenon. FIG. 4 shows a simulation result illustrating the effect of the invention. FIG. 5 shows an example of the cross-sectional structure of a device.

Figure 8:
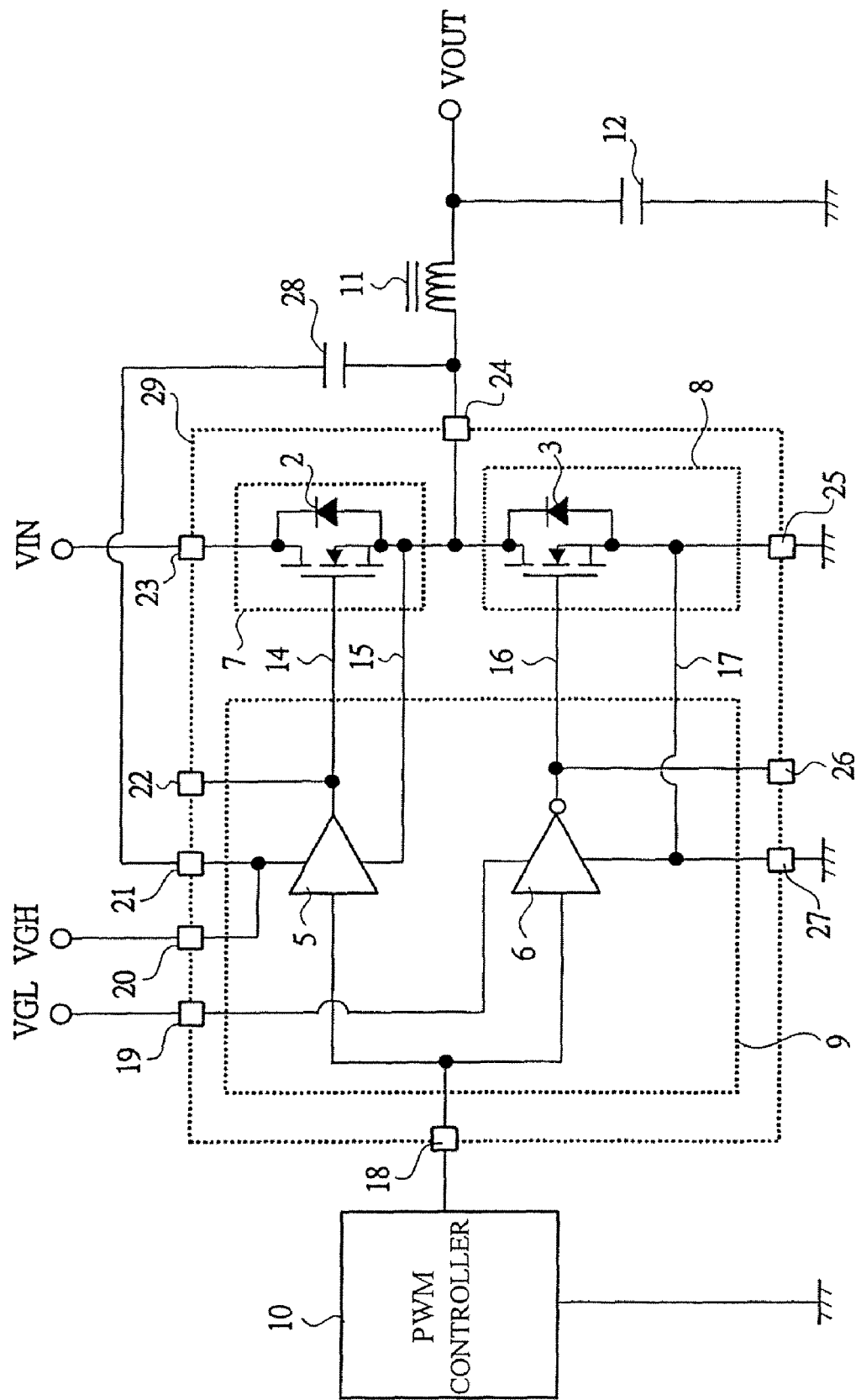
FIG. 8 shows an example of the circuit configuration of a conventional system-in-package that has been analyzed as a basis for the present invention.

FIG. 1 shows an example of the circuit configuration of the system-in-package of Embodiment 1. It is characterized in that, as compared with the above-described configuration of the conventional circuit shown in FIG. 8, an auxiliary MOSFET 4 for short-circuiting the gate-source junction is fabricated on the same chip as the low-side MOSFET 3. Another feature is that the gate of the auxiliary MOSFET 4 is driven, via a wire 13, by a driver 5 for driving a high-side MOSFET 2.

Thus, the system-in-package 1 of Embodiment 1 comprises the high-side MOSFET 2 as the high-side switch, the low-side MOSFET 3 as the low-side switch, the auxiliary MOSFET 4 as the auxiliary switch, and the drivers 5 and 6 for driving the individual MOSFETs. The high-side MOSFET 2 is disposed on a semiconductor chip 7, the low-side MOSFET 3 and the auxiliary MOSFET 4 are disposed on a semiconductor chip 8, and the drivers 5 and 6 are disposed on a semiconductor chip 9. The three semiconductor chips are fabricated in a single package.

Figure 9:
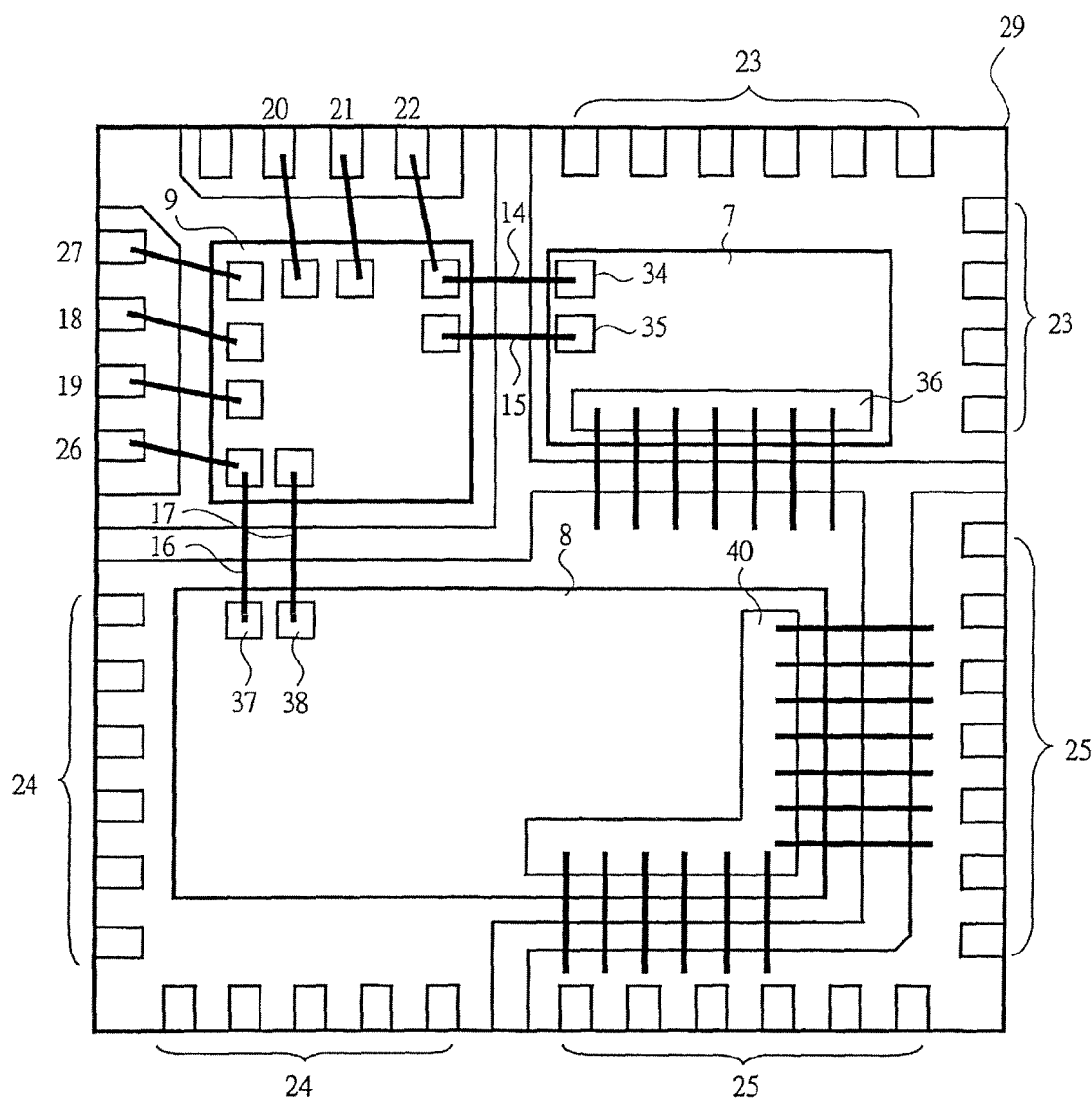
FIG. 9 shows an example of the package exterior view, chip configuration, and wire bonding configuration of the conventional system-in-package analyzed as a basis for the present invention.
Figure 10:
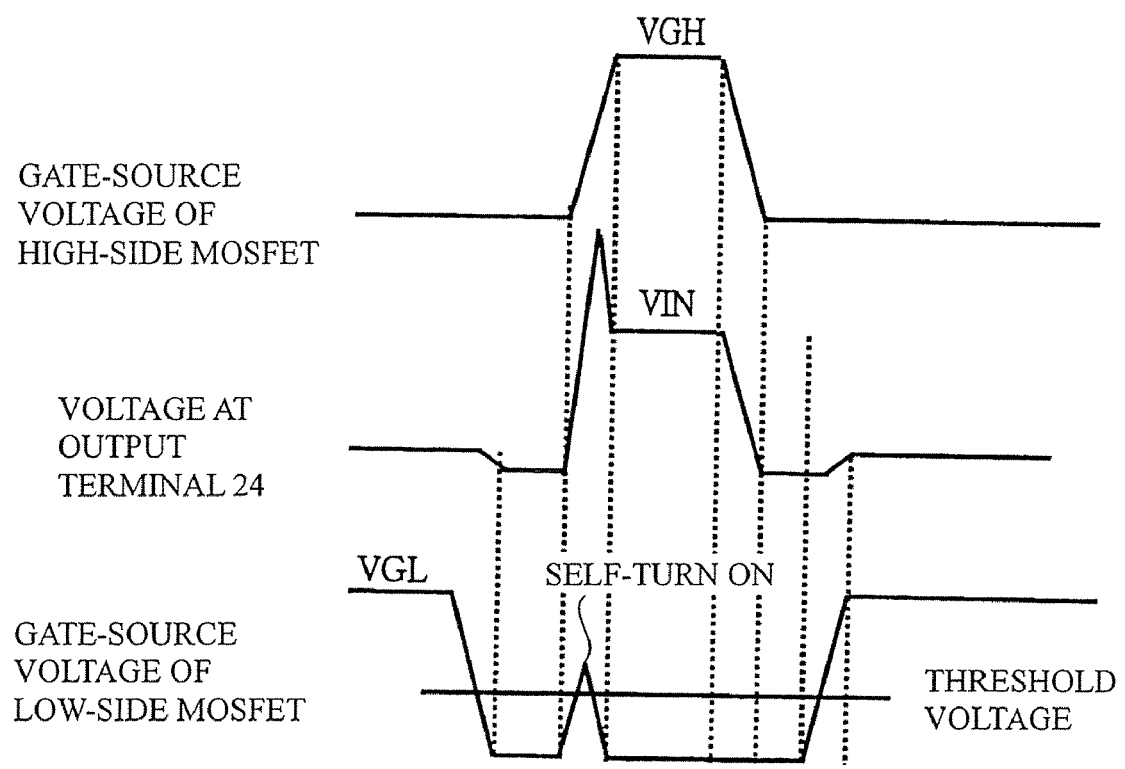
FIG. 10 shows a timing chart of individual voltages illustrating the self-turn-on phenomenon in the conventional system-in-package analyzed as a basis for the invention.

FIG. 2 shows an example of the package exterior view, chip configuration, and wire bonding configuration of the system-in-package of Embodiment 1. It is characterized in that, as compared with the above-described conventional system-in-package shown in FIG. 9, the semiconductor chip 8 of the low-side MOSFET 3 is provided with a gate pad 39 for the auxiliary MOSFET 4, and that a gate potential for driving the high-side MOSFET 2 is transmitted to the gate pad 39 of the auxiliary MOSFET via wires 13.

The semiconductor chip 7 is provided with a gate pad 34 for the high-side MOSFET 2, a source pad (for driver-source connection) 35, and another source pad (for main current) 36. The semiconductor chip 8 is provided with a gate pad 37 for the low-side MOSFET 3, a source pad (for driver-source connection) 38, the gate pad 39 for the auxiliary MOSFET 4, and a source pad (for main current) 40 for the low-side MOSFET 3.

A portion of a group of wires 13 that are wire-bonded on the semiconductor chip 9 for the drivers 5 and 6 may be disposed within the semiconductor chip 9.

In this system-in-package 1, because the auxiliary MOSFET 4 is driven by the driver 5 for the high-side MOSFET 2, there is no need to provide the package with additional pins for driving purposes, and thus it can easily replace conventional products.

FIG. 3 shows a timing chart of individual voltages for illustrating the effect of Embodiment 1 preventing the self-turn-on phenomenon. When the low-side MOSFET 3 switches from on to off, a feedback current starts to flow in the body diode of the low-side MOSFET 3, resulting in a drop in the voltage at the output terminal 24 below zero to the extent of the forward voltage of the body diode. When the period (dead time) when both the low-side MOSFET 3 and the high-side MOSFET 2 are off elapses, the high-side MOSFET 2 starts to turn on. In response, the voltage at the output terminal 24 also starts to increase. As mentioned above, when the voltage at the output terminal 24 starts to rise, the gate-source voltage of the low-side MOSFET 3 also starts to rise in a synchronized manner, and when the voltage at the output terminal reaches peak voltage, the gate-source voltage of the low-side MOSFET 3 also reaches peak voltage.

In Embodiment 1 of the invention, in which the auxiliary MOSFET 4 is disposed across the gate-source junction of the low-side MOSFET 3, the gate voltage for driving the auxiliary MOSFET 4 is provided by the gate potential of the high-side MOSFET 2, and the gate voltage for the high side is determined with reference to the output terminal 24 as the reference potential. Thus, the voltage applied between the gate and source of the auxiliary MOSFET 4 is the sum of the gate-source voltage of the high-side MOSFET 2 and the voltage at the output terminal 24. Namely, the auxiliary MOSFET 4 is already on before the voltage at the output terminal 24 reaches peak voltage, so that the charge current flows in the gate-source capacitance of the low-side MOSFET 3, thereby preventing the increase in the gate-source voltage of the low-side MOSFET 3. As a result, the self-turn-on phenomenon can be prevented.

Meanwhile, the auxiliary MOSFET 4 could potentially make it difficult for the low-side MOSFET 3 to turn on. However, when the high-side MOSFET 2 turns off, a feedback current starts to flow through the inherent body diode of the low-side MOSFET 3, so that the voltage at the output terminal 24 drops below zero to the extent of the forward voltage of the body diode. As a result, the voltage applied to the auxiliary MOSFET 4 becomes small enough that the auxiliary MOSFET 4 does not pose any problem when the low-side MOSFET 3 turns on next.

The question of to what extent the increase in the gate-source voltage of the low-side MOSFET 3 can be prevented by the auxiliary MOSFET 4 greatly depends on the parasitic inductance that exits between the gate of the low-side MOSFET 3 and the auxiliary MOSFET 4. Specifically, if the parasitic inductance is large, a charge current flows through the gate-source capacitance of the low-side MOSFET 3 before a current flows through the drain-source junction of the auxiliary MOSFET 4, resulting in an increase in the gate-source voltage of the low-side MOSFET 3.

FIG. 4 shows the result of simulating the influence of the parasitic inductance between the gate of the low-side MOSFET 3 and the drain of the auxiliary MOSFET 4 as described above. Specifically, the gate-source voltage of the low-side MOSFET 3 was simulated for a case where the auxiliary MOSFET 4 was absent, a case where the auxiliary MOSFET 4 and the low-side MOSFET 3 were disposed on separate chips in the same package (with parasitic inductance of approximately 1 nH), and a case where the auxiliary MOSFET 4 and the low-side MOSFET 3 were disposed on the same chip (with parasitic inductance of approximately 0.1 nH).

The results revealed that when the auxiliary MOSFET 4 and the low-side MOSFET 3 are disposed on separate chips in the same package, the gate-source voltage of the low-side MOSFET 3 increases to approximately 1.5 V, such that a power MOSFET with the threshold voltage on the order of 1 V, for example, cannot be used for the low-side application. On the other hand, when the auxiliary MOSFET 4 and the low-side MOSFET 3 are disposed on the same chip, the increase of the gate-source voltage of the low-side MOSFET 3 can be controlled to be less than 1 V, such that a power MOSFET with threshold voltage on the order of 1 V or less, for example, can be used for the low-side application.

FIG. 5 shows a cross section of an example of a device where the above-described low-side MOSFET 3 and auxiliary MOSFET 4 are included in a single chip. Generally, in power supply DC/DC converters, the low-side switch is constructed of a trench power MOSFET, which has low on-resistance. The example shown also employs a trench power MOSFET built inside with an auxiliary MOSFET. Numeral 43 indicates the cross-sectional structure of one cell of a low-side MOSFET 3, which constitutes the main portion. Numeral 44 indicates the cross-sectional structure of one cell of an auxiliary MOSFET 4.

The low-side MOSFET cell 43 is a trench power MOSFET of the so-called vertical type. It has a structure such that a trench is formed in an n⁻ epitaxial layer and a p-type diffusion layer 46 on an n+ substrate, in which trench a polysilicon electrode 49 for the gate is embedded via a gate oxide film 47. When voltage is applied to the polysilicon electrode 49 of the gate, an inversion layer is produced in a p-type diffusion layer 46, whereby the MOSFET conducts. In order to ensure a breakdown voltage in the peripheral areas, the p-type diffusion layer is comprised of a deep p-type well layer. The auxiliary MOSFET cell 44 is a lateral MOSFET with a planar electrode structure. As shown, it is formed in a region peripheral to the low-side MOSFET cell 43, where a gate polysilicon electrode 50 is formed via a gate oxide film 48. The low-side MOSFET cell 43 and the auxiliary MOSFET cell 44 are connected by means of an AL electrode 52 on an insulating film 51.

In this cross-sectional structure of the device, the gate oxide film 48 of the auxiliary MOSFET cell 44 and the gate polysilicon electrode 50 of the gate can be formed simultaneously with the formation of the gate oxide film 47 of the low-side MOSFET cell 43 and the gate polysilicon electrode 49. Furthermore, the p-type diffusion layer 45 and an n⁺ contact layer can also be formed simultaneously with the formation of the low-side MOSFET cell 43. Thus, the auxiliary MOSFET cell 44 can be formed by the conventional power MOSFET fabrication process and there is no need for an additional process.

The auxiliary MOSFET cell 44 shown in FIG. 5 has the following two features.

(1) The drain-source breakdown voltage is lower than that of the main low-side MOSFET 43.

Because the auxiliary MOSFET cell 44 retains the drain-source breakdown voltage with the p-type diffusion layer 45 and the n⁺ contact layer, the drain-source breakdown voltage is lower than that of the low-side MOSFET cell 43. However, the drain-source breakdown voltage of the auxiliary MOSFET cell 44 needs only to be higher than the voltage applied between the gate and source of the low-side MOSFET cell 43, and, generally, the gate-driving voltage for the MOSFETs in DC/DC converters used in CPUs is approximately 5 V. Therefore, drain-source breakdown voltage of 5 V or higher can be easily ensured with the structure shown in FIG. 5.

(2) The gate-source breakdown voltage is higher than that of the main low-side MOSFET cell 43.

As shown in the timing chart of FIG. 3, across the gate-source junction of the auxiliary MOSFET cell 44, a voltage that is the sum of the voltage at the output terminal 24 and the gate-source voltage of the high-side MOSFET 2 is applied. Generally, in the DC/DC converters used in CPUs, the input voltage is approximately 12 V and the gate driving voltage is approximately 5 V. Therefore, if there is a possibility of the output terminal voltage jumping up to approximately 20 V, a gate-source breakdown voltage of approximately 25 V would have to be provided. Since the gate oxide film 48 of the auxiliary MOSFET cell 44 is formed simultaneously with the gate oxide film 47 of the low-side MOSFET cell 43, the individual gate oxide films have the same film thickness. However, in trench power MOSFETs, such as the low-side MOSFET cell 43, electric field concentration tends to occur at the curved portion at the bottom of the trench gate. Thus, the gate-source breakdown voltage becomes lower than that of the planar gate structure indicated by the auxiliary MOSFET cell 44.

In other words, although the gate oxide film 48 of the auxiliary MOSFET cell 44 and the gate oxide film 47 of the low-side MOSFET cell 43 have the same film thickness, the gate-source breakdown voltage is higher for the auxiliary MOSFET cell 44. Generally, when the gate oxide film thickness is adapted in a trench gate structure such that the gate-source breakdown voltage is approximately 12 V, the breakdown voltage of approximately 30 V would be ensured in a planar gate structure. Therefore, a sufficient gate-source breakdown voltage can be ensured for the auxiliary MOSFET cell 44 by forming the individual gate oxide films with such a film thickness.

Thus, in accordance with Embodiment 1 of the invention, the low-side MOSFET 3 and the auxiliary MOSFET 4 for preventing the self-turn-on phenomenon are fabricated on a single chip, whereby the self-turn-on phenomenon can be prevented and power conversion efficiency can be significantly increased. Furthermore, because the self-turn-on phenomenon is prevented within the system-in-package, the same pin configuration as that of existing products can be realized, thus enabling easy replacement.

Furthermore, by driving the auxiliary MOSFET 4 using the driver 5 for the high-side MOSFET 2, the self-turn-on phenomenon can be prevented without the need for a new driver circuit.

Embodiment 2

Figure 6:
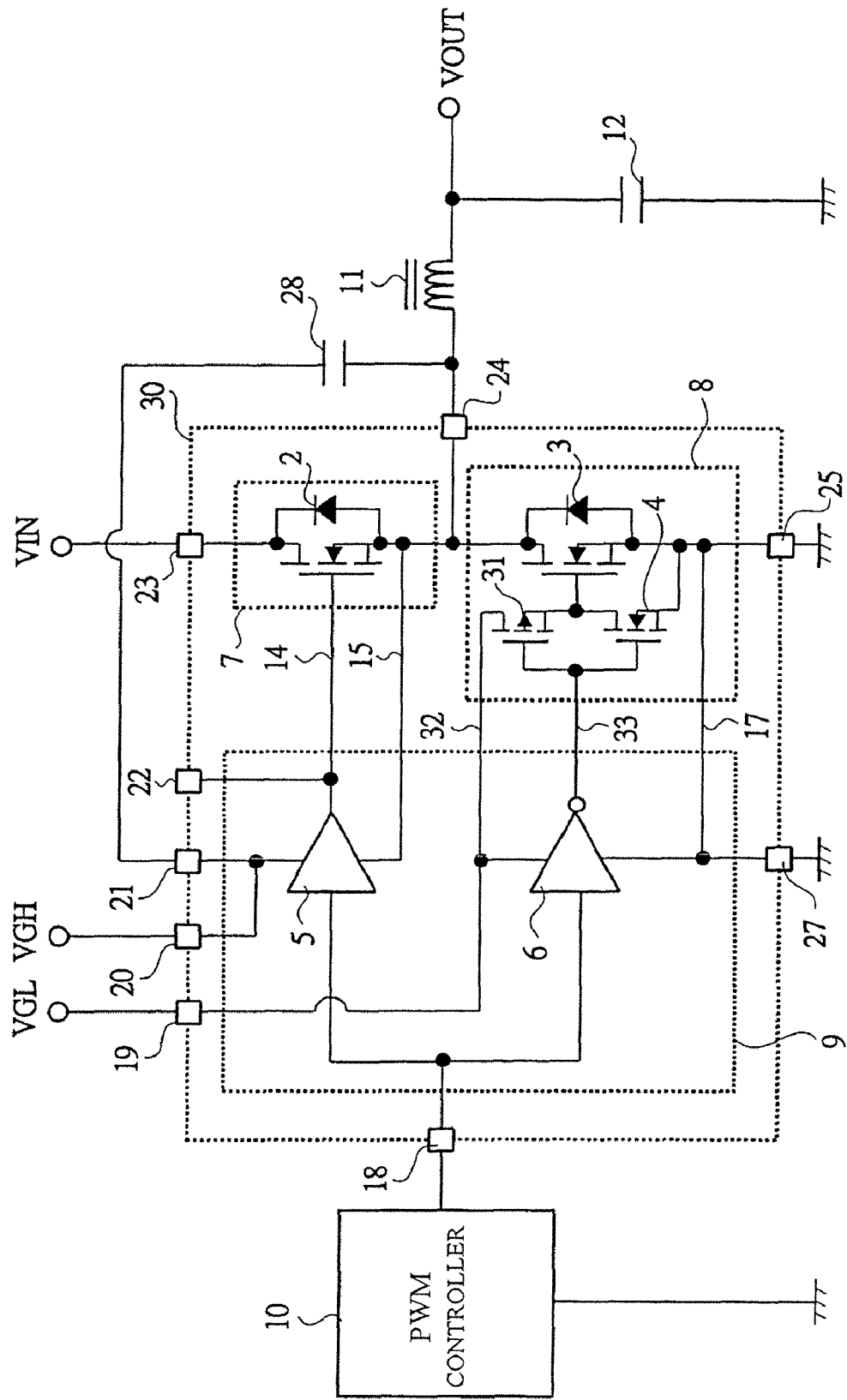
FIG. 6 shows an example of the circuit configuration of a system-in-package in accordance with Embodiment 2.
Figure 7:
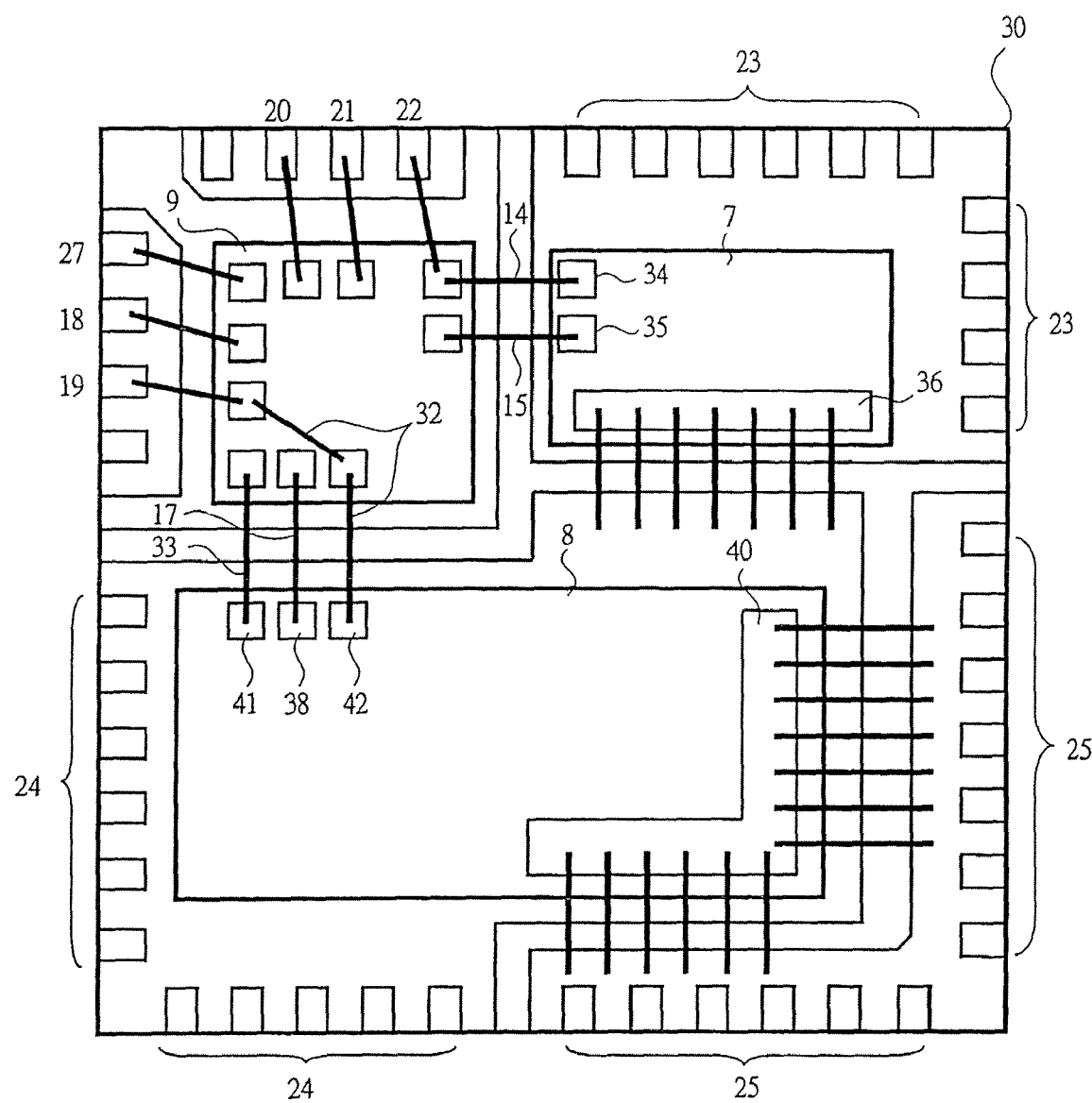
FIG. 7 shows an example of the package exterior view, chip configuration, and wire bonding configuration of Embodiment 2.

FIG. 6 shows an example of the circuit configuration of a system-in-package according to a second embodiment of the invention. FIG. 7 shows an example of the exterior view of the package, chip configuration, and wire bonding configuration of the example shown in FIG. 6.

FIG. 6 shows an example of the circuit configuration of the system-in-package according to the second embodiment of the invention. The example is based on Embodiment 1 shown in FIG. 1 to which a pre-driver is further added in front of the gate of the low-side MOSFET 3, with the final stage of the pre-driver driving the low-side MOSFET 3 disposed on the same chip. Specifically, in the system-in-package 30 of Embodiment 2, the p-type auxiliary MOSFET 31 for driving the gate of the low-side MOSFET 3 is disposed on the same chip, with the auxiliary MOSFET 31 and another auxiliary MOSFET 4 constituting an inverter. The low-side MOSFET 3 is comprised of a trench vertical power MOSFET, and the auxiliary MOSFETs 4 and 31 are comprised of planar lateral MOSFETs, as in Embodiment 1.

The drive voltage for the pre-driver is fed through a wire 32 and via an input terminal 19 for the gate voltage of the low-side MOSFET 3. In this structure, in addition to the prevention of the self-turn-on phenomenon as described in the foregoing embodiment, the ability to drive the gate of the low-side MOSFET 3 can be enhanced due to the built-in auxiliary MOSFETs 31 and 4 for turning on and off the low-side MOSFET 3, thereby achieving further reduction of loss.

FIG. 7 shows an example of the package exterior view, chip configuration, and wire bonding configuration of the system-in-package of Embodiment 2. The example is characterized in that, as compared with the system-in-package of Embodiment 1 shown in FIG. 2, an auxiliary inverter driving pad 41 is provided at the position of the gate pad 37 of the low-side MOSFET 3 for providing the potential of the driver 6 via a wire 33. Furthermore, another auxiliary inverter input voltage pad 42 is provided at the position of the gate pad 39 for the driving of the auxiliary MOSFET 4, so that the potential at an input terminal 19 for the gate voltage of the low-side MOSFET 3 can be provided to the auxiliary inverter input voltage pad 42 via wires 32.

A portion of a group of wires 32 that are wire-bonded over the semiconductor chip 9 of the driver may be wired within the semiconductor chip 9.

Thus, in Embodiment 2 as well, there is no need to provide the package with additional pins for driving purposes, as in Embodiment 1, thereby facilitating replacement with existing products. Although not shown in the drawings, the auxiliary MOSFET 31 can be built inside the low-side MOSFET 3 by providing a new n-type well layer and using a p-type contact layer.

Particularly, in accordance with Embodiment 2, by disposing the low-side MOSFET 3 and the auxiliary MOSFET 31 on the same chip, the ability to drive the low-side MOSFET 3 is enhanced and the self-turn-on phenomenon is prevented, thereby further improving power conversion efficiency.

Embodiment 3

Figure 12:
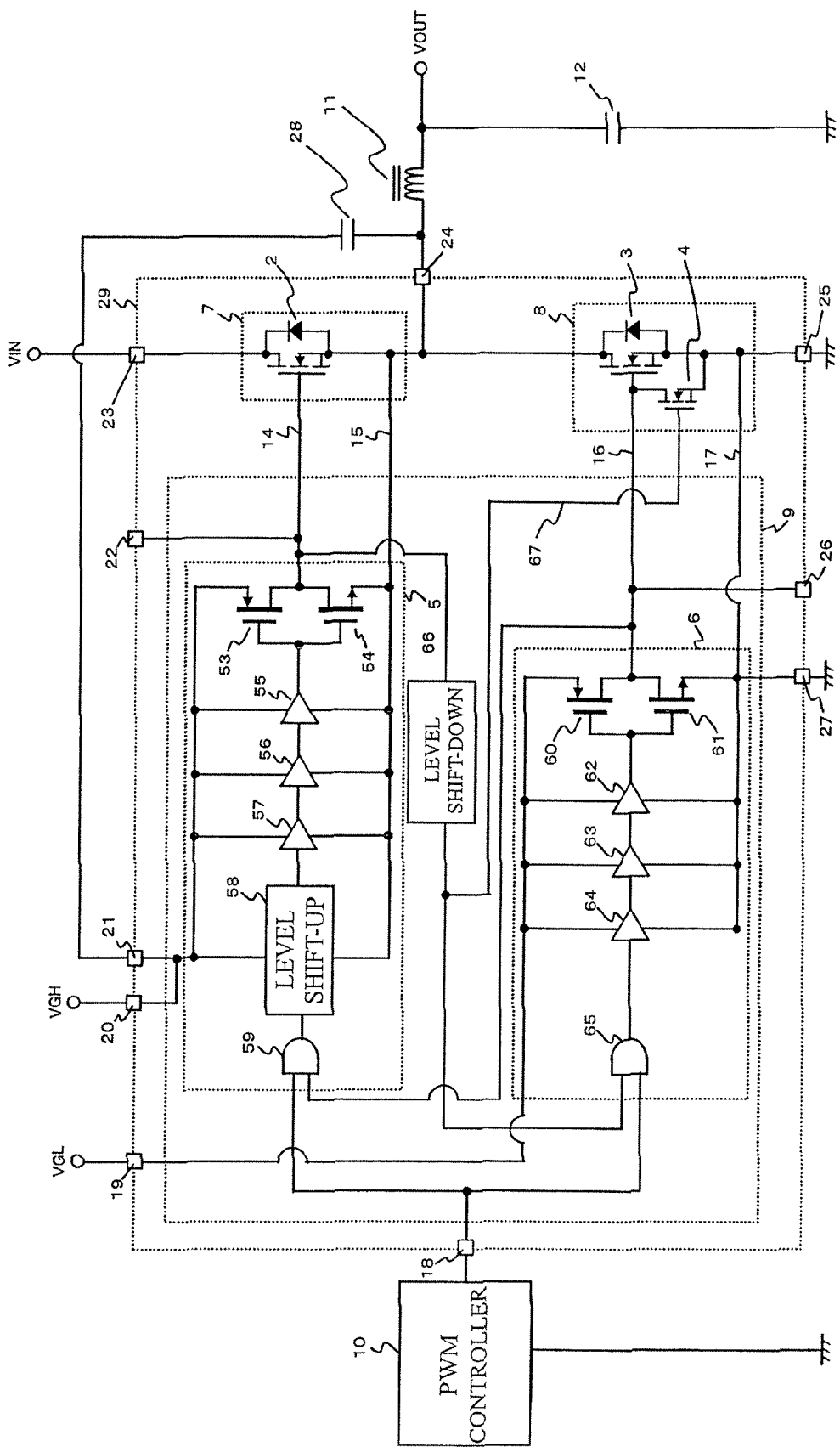
FIG. 12 shows an example of the circuit configuration of a system-in-package in accordance with Embodiment 3.
Figure 13:
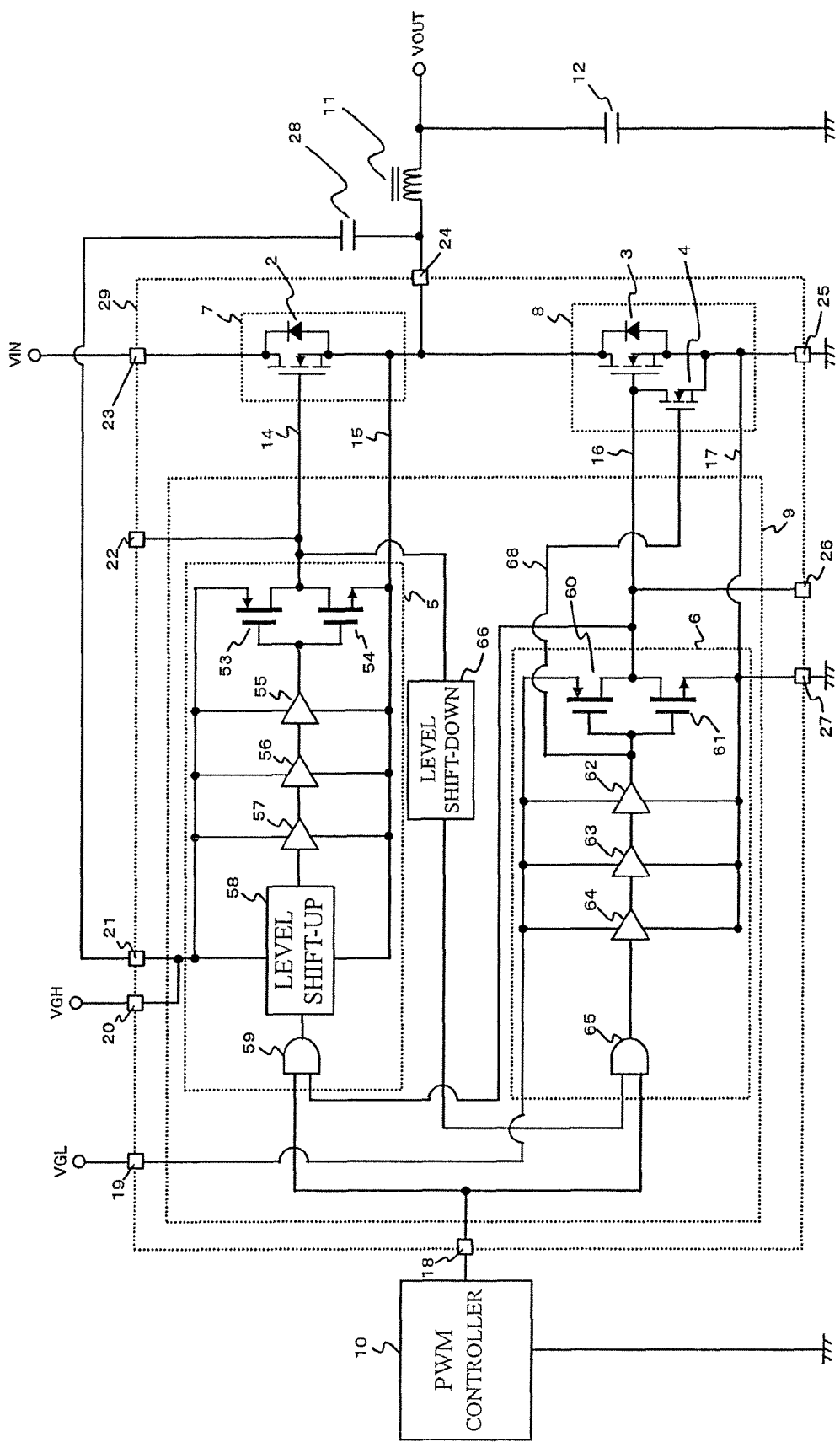
FIG. 13 shows another example of the circuit configuration of the system-in-package of Embodiment 3.

FIGS. 12 and 13 show an example of the circuit configuration of a system-in-package in accordance with a third embodiment of the invention.

In Embodiment 1, the auxiliary switch is driven by the driver for driving the high-side switch. In Embodiment 3, in order to reduce the driving voltage for the auxiliary switch, the auxiliary switch is driven with:

(1) a signal obtained by reducing the level of the output of the driver for driving the high-side switch; or (2) a driver signal in a stage prior to the final stage of the driver for driving the low-side switch.

Figure 11:
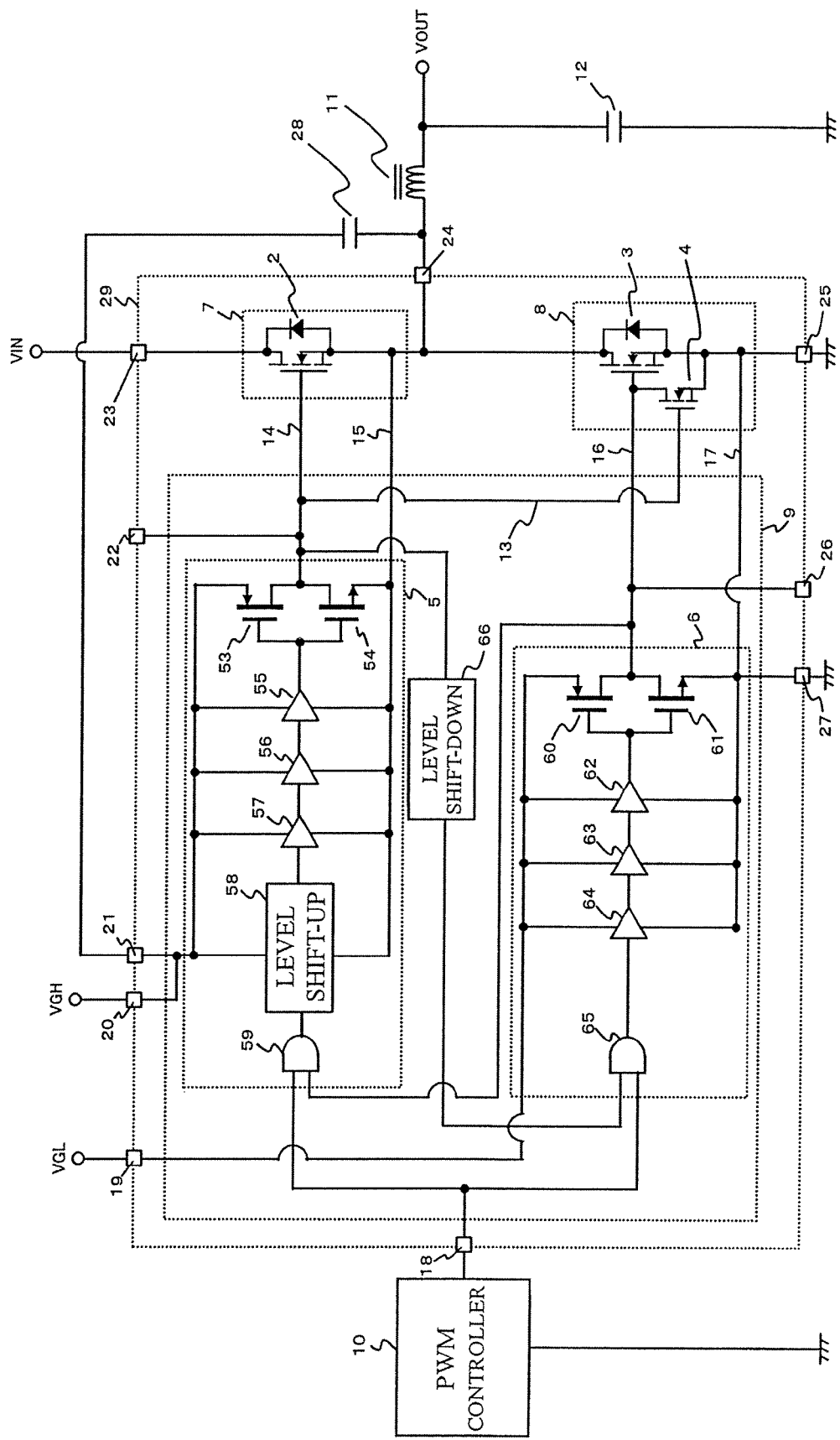
FIG. 11 shows the driver portion in an example of the circuit configuration of the system-in-package of Embodiment 1.

FIG. 11 shows an example of the circuit configuration of the system-in-package according to Embodiment 1 for DC/DC converters, illustrating the driver unit for driving the MOSFETs in detail. The driver 5 for driving the high-side switch is made up of: a p-type MOSFET 53 and an n-type MOSFET 54 that constitute the final portion of the driver output stage; drivers 55, 56, and 57 in an earlier stage; a level shift-up circuit 58; and a logic circuit 59 for preventing the high-side MOSFET 2 and the low-side MOSFET 3 from simultaneously turning on. Although there are four output stages in the illustrated example, more or fewer output stages may be used. The driver 6 for driving the low-side switch is made up of: a p-type MOSFET 60 and an n-type MOSFET 61 in the final portion of the driver output stage; drivers 62, 63, and 64 in an earlier stage; and a logic circuit for preventing the high-side MOSFET 2 and the low-side MOSFET 3 from simultaneously turning on. The logic circuit 65 is further provided with a level shift-down circuit 66 for the input of an output signal from the high side. In Embodiment 1 of the invention, as shown in FIG. 11, the output of the driver for driving the high-side switch is fed via wires 13 to the auxiliary switch 4 for driving the same. For this reason, the auxiliary switch 4 is driven by the voltage which is the sum of the input voltage VIN and the driver driving voltage VGH.

FIG. 12 shows an example of the circuit configuration of a system-in-package according to a third embodiment of the invention. The example is characterized in that an auxiliary switch 4 is driven, via a wire 67, by the output of the driver 5 for driving the high-side switch that has been stepped down by a level shift-down circuit 66. Because of the use of the stepped-down voltage provided by the level shift-down circuit 66, the auxiliary switch 4 can be driven by the driver driving voltage VGH.

FIG. 13 shows an example of the circuit configuration of another system-in-package according to Embodiment 3 of the invention. This example is characterized in that the auxiliary switch 4 is driven by the output of a driver 62 in a stage prior to the final stage of the driver 6 for driving the low-side switch. The output of the driver 62 has a phase exactly inverse to that of the output of the driver 6, such that, when the low-side MOSFET 3 is off, it produces a signal that turns on the auxiliary switch 4, thereby preventing the self-turn-on phenomenon. Further, because the output voltage of the driver 62 is a driver driving voltage VGL, the auxiliary switch 4 can be driven with a low voltage.

While the invention has been particularly shown and described with reference to preferred embodiments thereof, it will be understood by those skilled in the art that the foregoing and other changes in form and details can be made therein without departing form the spirit and scope of the invention.

For example, while the foregoing embodiments were concerned mainly with system-in-packages, the invention can also be adapted to other applications employing such system-in-packages, such as a DC/DC converter comprising a PWM controller, a smoothing inductor and capacitor. Further, the invention can be adapted to a power supply system employing such a DC/DC converter, such as a power supply system for personal computers or computer game machines.

What is claimed is:

1. A semiconductor device comprising:
a high-side switch;
a low-side switch;
drivers for driving said high-side switch and said low-side switch individually; and
an auxiliary switch that prevents self turn-on of said low-side switch and that is disposed between the gate and source of said low-side switch, wherein said high-side switch, said low-side switch, said drivers, and said auxiliary switch are included in a single package, said low-side switch and said auxiliary switch are disposed on the same chip, said low-side switch is comprised of a vertical MOSFET, said auxiliary switch is comprised of a lateral MOSFET, and a gate-source breakdown voltage of said MOSFET of said auxiliary switch is higher than a gate-source breakdown voltage of said MOSFET of said low-side switch.

2. The semiconductor device of claim 1, wherein said lateral MOSFET further comprises:
   a first auxiliary MOSFET, and
   a second auxiliary MOSFET.

3. The semiconductor device of claim 2, further comprising:
   a PWM controller for feeding a PWM signal to said driver for driving said high-side switch and to said driver for driving said low-side switch; and
   an inductor and a capacitor for smoothing voltages outputted from said high-side switch and said low-side switch.

4. The semiconductor device of claim 1, wherein said auxiliary switch is driven by the output of said driver for driving said high-side switch.

5. The semiconductor device of claim 1, wherein the gate-source breakdown voltage of said MOSFET for said low-side switch is 1 V or smaller.

6. A DC/DC converter for a semiconductor device comprising:
   a high-side switch;
   a low-side switch;
   a first driver for driving said high-side switch and a second driver for driving said low-side switch; and
   an auxiliary switch that prevents self turn-on of said low-side switch and that is disposed between the gate and source of said low-side switch, wherein said high-side switch, said low-side switch, said first driver, said second driver, and said auxiliary switch are included in a single package, said low-side switch and said auxiliary switch are disposed on the same chip, said low-side switch is comprised of a vertical MOSFET, and said auxiliary switch is comprised of a lateral MOSFET, and a gate-source breakdown voltage of said MOSFET of said auxiliary switch is higher than a gate-source breakdown voltage of said MOSFET of said low-side switch.

7. The DC/DC converter of claim 6, wherein said lateral MOSFET further comprises:
   a first auxiliary MOSFET, and
   a second auxiliary MOSFET.

8. The DC/DC converter of claim 6, wherein said auxiliary switch is driven by the output of said driver for driving said high-side switch.

9. The DC/DC converter of claim 6, wherein the gate-source breakdown voltage of said MOSFET for said low-side switch is 1 V or smaller.

10. The DC/DC converter of claim 6, further comprising:
    a PWM controller for feeding a PWM signal to said first driver for driving said high-side switch and to said second driver for driving said low-side switch; and
    an inductor and a capacitor for smoothing voltages outputted from said high-side switch and said low-side switch.

11. A power supply system for a semiconductor device comprising:
    a high-side switch;
    a low-side switch;
    drivers for driving said high-side switch and said low-side switch individually; and
    an auxiliary switch that prevents self turn-on of said low-side switch and that is disposed between the gate and source of said low-side switch, wherein said high-side switch, said low-side switch, said drivers, and said auxiliary switch are included in a single package, said low-side switch and said auxiliary switch are disposed on the same chip, said low-side switch is comprised of a vertical MOSFET, said auxiliary switch is comprised of a lateral MOSFET, and a gate-source breakdown voltage of said MOSFET of said auxiliary switch is higher than a gate-source breakdown voltage of said MOSFET of said low-side switch.

* * * * *